(12) United States Patent
Lam et al.

(10) Patent No.: US 9,482,871 B2
(45) Date of Patent: Nov. 1, 2016

(54) LIGHT CONCENTRATION AND ENERGY CONVERSION SYSTEM

(75) Inventors: Sio Kuan Lam, New Territories (HK); Tao Pan, Shenzhen (CN); Wei Zhou, Shenzhen (CN)

(73) Assignee: Hong Kong Applied Science and Technology Research Institute Co. Ltd., Shatin, New Territories (HK)

( * ) Notice: Subject to any disclaimer, the term of this patent is extended or adjusted under 35 U.S.C. 154(b) by 378 days.

(21) Appl. No.: 13/221,113

(22) Filed: Aug. 30, 2011

(65) Prior Publication Data

US 2013/0048052 A1 Feb. 28, 2013

(51) Int. Cl.
| | |
|---|---|
| G02B 27/14 | (2006.01) |
| H01L 31/0232 | (2014.01) |
| F24J 2/06 | (2006.01) |
| G02B 19/00 | (2006.01) |
| H01L 31/054 | (2014.01) |
| F24J 2/08 | (2006.01) |

(52) U.S. Cl.
CPC ............ *G02B 27/14* (2013.01); *F24J 2/067* (2013.01); *G02B 19/0028* (2013.01); *G02B 19/0042* (2013.01); *H01L 31/02325* (2013.01); *H01L 31/0543* (2014.12); *H01L 31/0547* (2014.12); *F24J 2/085* (2013.01); *Y02E 10/40* (2013.01); *Y02E 10/52* (2013.01)

(58) Field of Classification Search
CPC ............ Y02E 10/52; H01L 31/0524; H01L 31/0525; H01L 31/0522; H01L 31/0528
USPC ...................................................... 136/246
See application file for complete search history.

(56) References Cited

U.S. PATENT DOCUMENTS

| 4,411,490 A * | 10/1983 | Daniel ..................... 126/648 |
|---|---|---|
| 4,433,199 A * | 2/1984 | Middy ..................... 136/246 |
| 6,469,241 B1 | 10/2002 | Penn |
| 2008/0007472 A1 * | 1/2008 | Welch et al. ............ 343/770 |
| 2008/0048102 A1 * | 2/2008 | Kurtz et al. ............. 250/226 |
| 2008/0149162 A1 | 6/2008 | Martinelli et al. |
| 2008/0271776 A1 | 11/2008 | Morgan |
| 2009/0065044 A1 | 3/2009 | Kim |
| 2009/0314332 A1 | 12/2009 | Barnett et al. |
| 2009/0314333 A1 * | 12/2009 | Shepard .................. 136/248 |
| 2010/0032005 A1 | 2/2010 | Ford et al. |

(Continued)

FOREIGN PATENT DOCUMENTS

| WO | 2010033859 A2 | 3/2010 |
|---|---|---|
| WO | WO 2010033859 A2 * | 3/2010 |

OTHER PUBLICATIONS

First Office Action for App or Patent. No. 201110286676.8, Date of Issuance Feb. 28, 2013, Titled Light Concentration and Energy Conversion System, 10 Pages.

*Primary Examiner* — Jennifer Michener
*Assistant Examiner* — Sadie White
(74) *Attorney, Agent, or Firm* — Berkeley Law & Technology Group, LLP (57) ABSTRACT

An optical system for light energy concentration may comprise a light concentrator including two or more light-converging elements, a light splitting element to receive the converging light from the light-converging elements and to produce light having a first spectral component and light having a second spectral component, and a light directing element to direct the light having the first spectral component through a light guide and to direct the light having the second spectral component to a location external to the light guide.

25 Claims, 4 Drawing Sheets

(56) References Cited

U.S. PATENT DOCUMENTS

2010/0123954 A1 5/2010 Benitex et al.
2010/0212717 A1* 8/2010 Whitlock et al. ............. 136/246
2011/0162712 A1* 7/2011 Tillin et al. .................... 136/259
2011/0226332 A1* 9/2011 Ford et al. ..................... 136/259
2011/0273783 A1* 11/2011 Campbell et al. ............. 359/708

* cited by examiner

LIGHT CONCENTRATION AND ENERGY CONVERSION SYSTEM

FIELD

The subject matter disclosed herein relates to an optical system, and more particularly, to a concentrating photovoltaic system for light energy concentration.

BACKGROUND

Though sunlight, the energy source of solar power generation, is virtually free and abundant, these benefits of sunlight may be offset by a relatively high expense associated with solar power generating photovoltaic (PV) cells. Also, corresponding to relatively low efficiency of such PV cells, a relatively large area may be occupied by PV cells in order to generate a desired amount of electrical power. Accordingly, improvements in efficiency of PV cells may lead to reduced cost for solar power generation and/or increased capacity to generate solar power. A concentrating photovoltaic (CPV) system may operate by focusing sunlight via optical elements onto relatively small solar cells to reduce use of costly solar cell materials, for example. CPV technology is a relatively important method for converting sun energy into electricity.

BRIEF DESCRIPTION OF THE DRAWINGS

Non-limiting and non-exhaustive embodiments will be described with reference to the following objects, wherein like reference numerals refer to like parts throughout the various objects unless otherwise specified.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

In an embodiment, a light concentrating system may comprise one or more light-converging elements and a light guiding structure. Such a system may focus sunlight, for example, via optical elements onto relatively small photovoltaic (PV) cells to convert sun energy into electricity. Light-converging elements may concentrate incident sun light onto light splitting and/or directing elements. For example, a light splitting and/or directing element may spectrally partition converging light to produce light having a first spectral component and light having a second spectral component. In one implementation, such spectral components may comprise wavelength ranges of light. For example, a first spectral component may comprise a range of wavelengths of light between about 400.0 nanometers and about 880.0 nanometers and a second spectral component may comprise a range of wavelengths of light between about 880.0 nanometers and about 2000.0 nanometers, though claimed subject matter is not so limited. The light splitting and/or directing element may further direct the spectrally partitioned light through a light guiding structure and/or to a location external to the light guiding structure, as described in further detail below. One advantage, among others, provided by performing such light splitting or light directing may include an ability to concentrate light energy at relatively high levels compared to other light concentrating system configurations, for example. Another advantage may include light spectrum matching, wherein optical components and/or PV cells may be particularly optically matched to spectral ranges of light on which the optical components and/or PV cells are to operate. Still another advantage may be a relatively thin light concentrating system. A relative compactness of such a system may be achieved by particular optical elements and/or a particular configuration of such optical elements, as described in detail below. Yet another advantage may be in that a light concentrating system having two or more energy conversion elements (e.g., two or more PV cells) may lead to reduced operating temperatures of a light concentrating system. Accordingly, such a light concentrating system may provide a number of benefits that address a desire for a relatively efficient, small-size solar power-generating device having a relatively low cost. Of course, benefits of such a light concentrating system are not limited to those described above, and claimed subject matter is also not so limited.

Though PV cells are cited in embodiments, other energy conversion elements may be used. For example, in an implementation, an energy conversion element to convert light into different forms of energy, such as electricity and thermal, for example, may comprise PV cells and/or heat exchange devices, though claimed subject matter is not so limited.

Embodiments described herein may include particular configurations of optical elements and PV elements. For example, one particular configuration may comprise an array of light-converging elements to collect and converge light onto one or more light directing and/or splitting element to selectively reflect and transmit the collected and converged light. In a particular example, two or more light-converging elements may collect and converge light onto one light directing and/or splitting element. Such selectivity may be based, at least in part, on wavelength of the collected light. For example, a light splitter may reflect light having a particular range of wavelengths and direct such reflected light to a first PV cell. The light splitter may transmit light having another particular range of wavelengths and direct such transmitted light to one or more second PV cells. A light splitter may be configured to direct reflected or transmitted light to converge to a region coincident with a location of first and second PV cells, respectively. First and second PV cells may have operating wavelength ranges different from one another. A light concentrating system incorporating such PV cells may provide a number of benefits. For example, particular PV cells may operate relatively efficiently only over particular ranges of wavelengths. In other words, different PV cells may operate most efficiently in different ranges of wavelengths. For example, a double-junction (DJ) PV cell may operate most efficiently in a wavelength range from 310 nanometers (mn) to 880 nm while a GaSb solar cell may operate most efficiently in a wavelength range from 880 nm to 1270 nm, though claimed subject matter is not limited in this respect. Because sunlight comprises a relatively wide bandwidth of wavelengths, it may be advantageous to utilize multiple types of solar cells to generate electrical power from light having different spectral characteristics. Accordingly, an embodiment of a light concentrating system as described above, for example, may accommodate more than one type of PV cell, thereby increasing an overall sunlight spectrum available to the light concentrating system.

In some embodiments, a light splitting element and a light directing element may be combined into a single optical element, called a splitting and directing element (SDE). For example, a SDE may include at least one surface located relatively close to a focus point of one or more light-converging elements to receive light from the light-converging elements. A light concentrator, which may comprise multiple light-converging elements, may collect light over a relatively large area and concentrate the collected light into a relatively small area. A light concentrator may comprise refractive lenses or a combination of refractive lens (e.g., compound lenses), curved-surface mirrors, and/or Fresnel lenses, just to name a few examples. Such light concentrators may have an associated focal length determining a distance at which light reflecting from (or transmitting through) the light concentrators may be focused. Additionally, such light concentrators may have an associated numerical aperture (N.A.) determining an angle of convergence of a cone of light reflecting from the light concentrators. Such an angle of convergence may be described in terms of an f-number: An f-number (sometimes called focal ratio, f-ratio, f-stop, or relative aperture, for example) may express a focal length divided by an effective aperture diameter of a light concentrator, for example. An f-number may comprise a dimensionless number that is a quantitative measure of lens speed or steepness of a cone of light, for example. Light concentrators may concentrate light by converging light at a particular f-number and focusing the converged light at a particular focal length. Optical elements downstream of such light concentrators may be arranged based, at least in part, on a focal length and/or N.A. of the light concentrators, for example. An array of such light concentrators may comprise one or more light concentrators arranged in any number of possible patterns. In a particular example, such an array may comprise light concentrators arranged in rows and columns, though claimed subject matter is not so limited.

Figure 1:
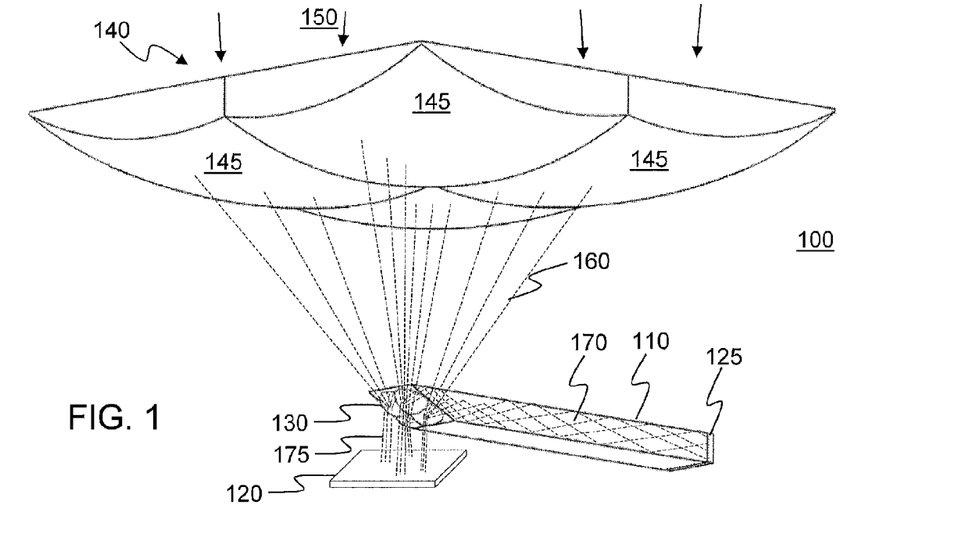
FIG. 1 is a perspective view of a light concentration and energy conversion system, according to an embodiment.
Figure 2:
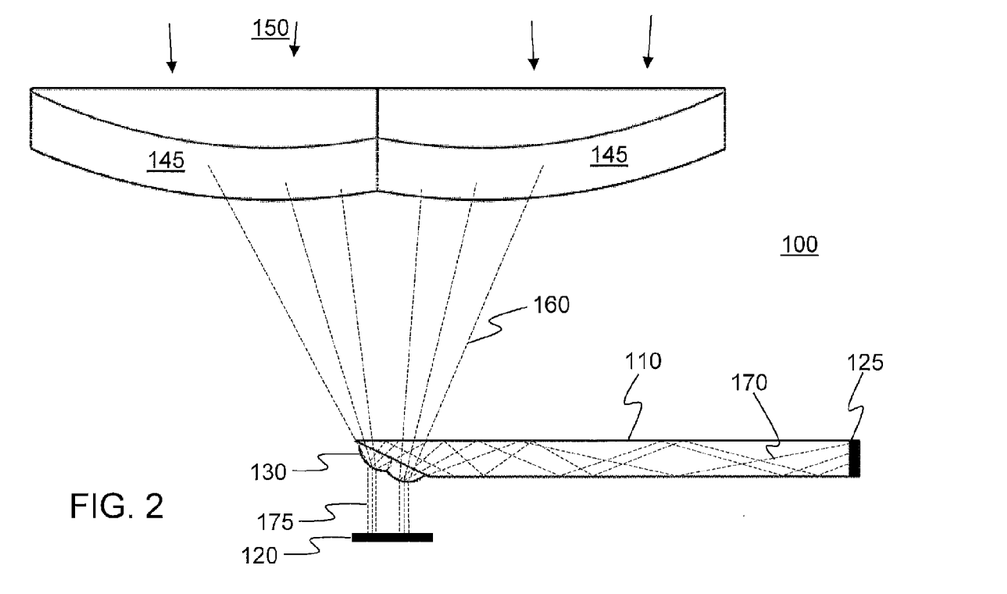
FIG. 2 is a cross-section of a light concentration and energy conversion system, according to an embodiment.

FIG. 1 is a perspective view and FIG. 2 is a cross-section of a light concentration system 100, according to an embodiment. System 100 may comprise an arrangement of optical elements such as lenses, mirrors, waveguides, and so on, to concentrate light incident over a relatively large area (e.g., an area of light concentrator 140) into a substantially smaller area (e.g., an area of SDE 130), for example. In particular, system 100 may include one or more light concentrators 140 that comprise a plurality of light-converging elements 145 to convert incident light 150 to a converging cone of light 160. In an embodiment, light-converging elements 145 may comprise eccentric type optical elements (e.g., having off-axis surface curvature or other asymmetrical thickness distribution). Light-converging elements 145 may comprise refractive lenses or a combination of refractive lens (e.g., compound lenses), curved-surface mirrors, and/or Fresnel lenses, just to name a few examples. In one implementation, such lens or mirrors may comprise any type of material, such as glass, plastic, or metal that may include one or more reflective coatings, as explained below. Light 150, which may comprise substantially parallel light from the sun, may impinge on a surface of light concentrator 140 and be transmitted (or reflected) into a cone of converging light 160. For example, light 150 transmitted by light concentrator 140 may be focused into a cone of light 160 having a particular f-number. Light 160 may be focused toward a SDE 130 optically coupled (e.g., located external) to a light guide 110. Such a SDE is described in further detail below. For example, SDE 130 and light guide 110 may be optically coupled so that light travelling inside SDE 130 may transmit into an inside portion of light guide 110, or vise versa. Such optical coupling may or may not involve physical contact between SDE 130 and light guide 110. SDE 130 may spectrally partition light 160 into two or more spectral portions. SDE 130 may direct a first spectral portion of light 170 into light guide 110, which may carry the directed light to a first energy conversion element 125, for example. SDE 130 may direct a second spectral portion of light 175 to a location external to light guide 110, where a second energy conversion element 120 may be located, for example. Thus, in an implementation, SDE 130 comprises a single optical element comprising a light splitting element and a light directing element. Light beams from two or more light-converging elements 145 may share a SDE and a light guide. First and/or second energy conversion elements 120 and 125 may comprise one or more devices able to convert concentrated light to another form of energy, such as electricity (e.g., via photovoltaic cells) or heat (e.g., via a heat exchanger), just to name a few examples.

In an implementation, SDE 130 may comprise one or more refractive lenses optically coupled to an end-surface of light guide 110. Such an end-surface may be angled with respect to an optical axis of light guide 110. Refractive lenses of SDE 130 may be optically coated with multiple thin films to spectrally partition light 160 received via a portion of light guide 110. In other words, light 160 may transmit through a portion of light guide 110 before impinging on inside surfaces of SDE 130. Thus, as explained above, SDE 130 may internally reflect a first spectral portion of light 170 into light guide 110, while transmitting a second spectral portion of light 175 to a location external to light guide 110. In one implementation, with sufficient fabrication tolerances SDE 13Q may operate properly regardless of whether an angle of converging light 160 deviates.

As mentioned above, refractive lenses of SDE 130 may be optically coated with multiple thin films to spectrally partition light. In detail, optical coatings may comprise one or more dielectric films (e.g., magnesium fluoride, zinc oxide, titanium dioxide, just to name a few examples) having thicknesses of the order of a wavelength of light on which the optical coatings operate. For example, a thickness of a dielectric film may be about 100.0 nanometers to about several microns, though claimed subject matter is not so limited. Dielectric films may be placed on optical surfaces by a physical vapor deposition process, for example.

Light guide 110 may comprise any of a number of types of light guides, such as a rod-type light guide, for example. Once coupled into light guide 110, light may travel along the inside of light guide 110 by way of total internal reflection, for example, to reach energy conversion element 125. Of course, such details of a light concentration system are merely examples, and claimed subject matter is not so limited.

Figure 3:
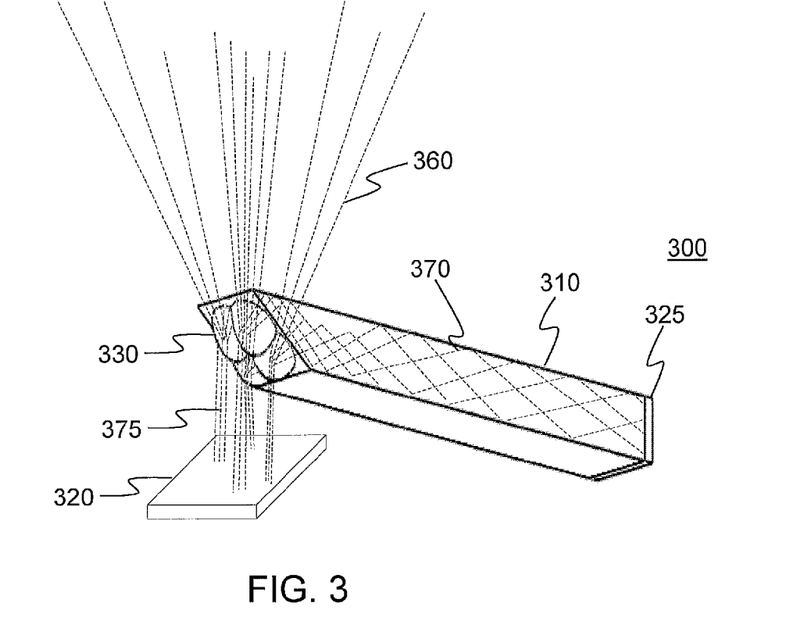
FIG. 3 is a perspective view of a portion of a light concentration and energy conversion system, according to an embodiment.

FIG. 3 is a perspective view of a portion of a light concentration and energy conversion system, according to an embodiment, which may be similar to that shown in FIGS. 1 and 2. System 300 may comprise one or more light concentrators (not shown) that comprise a plurality of light-converging elements, similar to elements 145 in FIG. 1, for example. Such light-converging elements may produce a converging cone of light 360. Light 360 may converge toward a SDE 330 optically coupled to a light guide 310. SDE 330 may comprise individual lenses that are optically coated with one or more thin films to spectrally partition light 360 into two or more spectral portions 370 and 375. SDE 330 may internally reflect a first spectral portion of light 370 into light guide 310, which may carry light 370 to a first energy conversion element 325, for example. SDE 330 may transmit a second spectral portion of light 375 to a location external to light guide 310, where a second energy conversion element 320 may be located, for example. SDE 330 may comprise quartz, sapphire, polymethyl methacrylate (PMMA), polycarbonate (PC), or other optical material, though claimed subject matter is not so limited.

Figure 4:
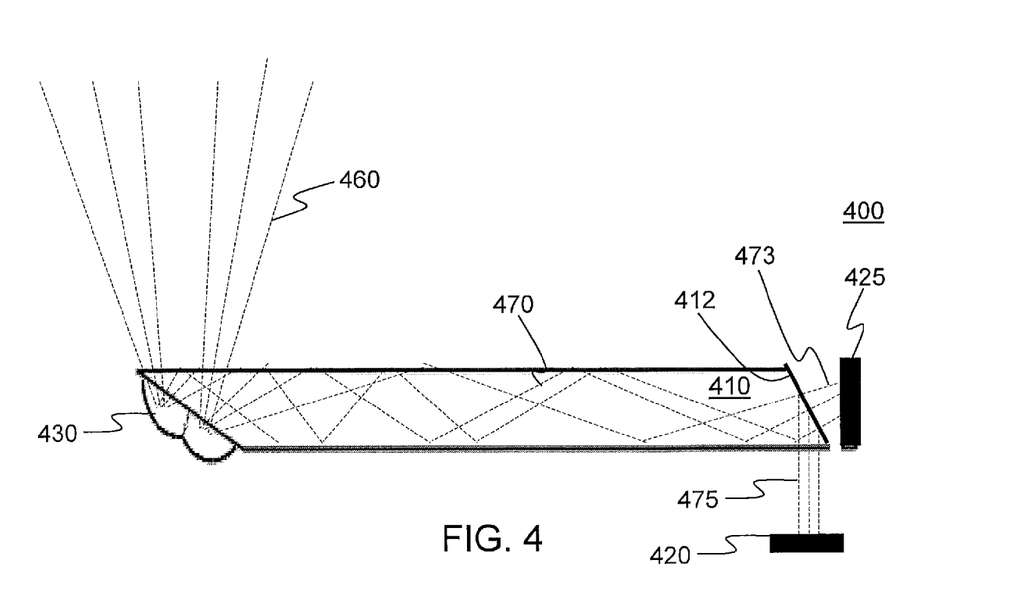
FIGS. 4-8 are cross-sections of a portion of light concentration systems, according to embodiments.

FIG. 4 is a side view of a portion of a light concentration system, according to an embodiment 400. A light director 430, optically coupled to a light guide 410, may comprise one or more lenses having an inside surface from which converging light 460 reflects. For example, light 460 may transmit through a portion of light guide 410 before impinging on inside surfaces of light director 430. Light 470, reflected from inside surfaces of light director 430, may then travel generally along an optical axis of light guide 410. Light 470 may comprise multiple spectral portions of light, which may be spectrally partitioned by light splitter 412. In one implementation, light splitter 412 may comprise an optically coated end-surface of light guide 410. Such an optical coating may comprise one or more thin films, as described above, for example. In another implementation, light splitter 412 may comprise an optical element (e.g., an optically coated window) optically coupled to an end-surface of light guide 410. Light splitter 412 may spectrally partition light 470 into two or more spectral portions 473 and 475. Light splitter 412 may internally reflect a first spectral portion of light 475 to a location external to light guide 410 via one surface of light guide 410. Light 475 may then impinge on a first energy conversion element 420, for example. Light splitter 412 may transmit a second spectral portion of light 473 to another location external to light guide 410 via another surface of light guide 410. Light 473 may then impinge on a second energy conversion element 425, for example.

Figure 5:
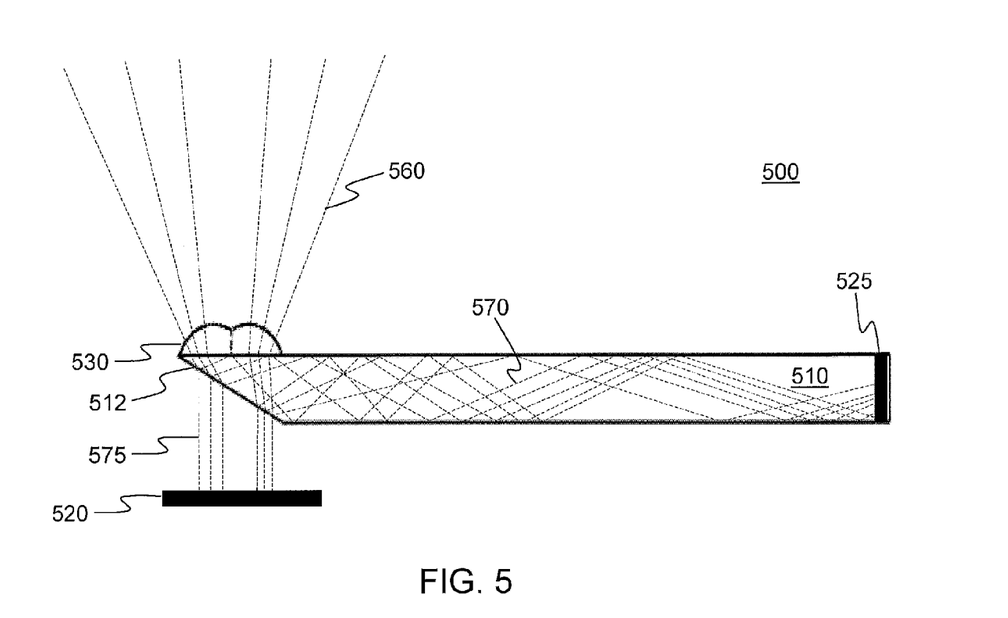

FIG. 5 is a cross-section of a portion of a light concentration and energy conversion system 500, according to an embodiment. System 500 may comprise one or more light concentrators (not shown) that comprise a plurality of light-converging elements, similar to elements 145 in FIG. 1, for example. Such light-converging elements may produce a converging cone of light 560. A light director 530, optically coupled to a light guide 510, may comprise one or more lenses through which converging light 560 transmits. For example, light director 530 and light guide 510 may be optically coupled so that light travelling inside light director 530 may transmit into an inside portion of light guide 510. Such optical coupling may or may not involve physical contact between light director 530 and light guide 510. In one implementation, light 560 entering light director 530 may be collimated to produce substantially parallel light. In another implementation, light 560 entering light director 530 may be collimated to produce light entering light guide 510 having a reduced convergence angle or increased f-number compared to light 560.

Collimated light resulting from transmission through light director 530 may transmit through a portion of light guide 510 before impinging on an inside end-surface of light guide 510, which may comprise a light splitter 512. Such collimated light may comprise multiple spectral portions of light, which may be spectrally partitioned by light splitter 512. In one implementation, light splitter 512 may comprise an optically coated end-surface of light guide 510. Such an optical coating may comprise one or more thin films, as described above, for example. In another implementation, light splitter 512 may comprise an optical element (e.g., an optically coated window) optically coupled to an end-surface of light guide 510. Light splitter 512 may spectrally partition light collimated by light director 530 into two or more spectral portions 570 and 575. Light splitter 512 may internally reflect a first spectral portion of light 570 generally along an optical axis of light guide 510, which may carry light 570 to a first energy conversion element 525, for example. Light splitter 512 may direct a second spectral portion of light 575 to a location external to light guide 510, where a second energy conversion element 520 may be located, for example. Light 560 may be produced by two or more light-converging elements (e.g., light-converging elements 145, shown in FIG. 1). First and/or second energy conversion elements 520 and 525 may comprise one or more devices able to convert concentrated light to another form of energy, such as electricity (e.g., via PV cells) or heat (e.g., via a heat exchanger), just to name a few examples.

Figure 6:
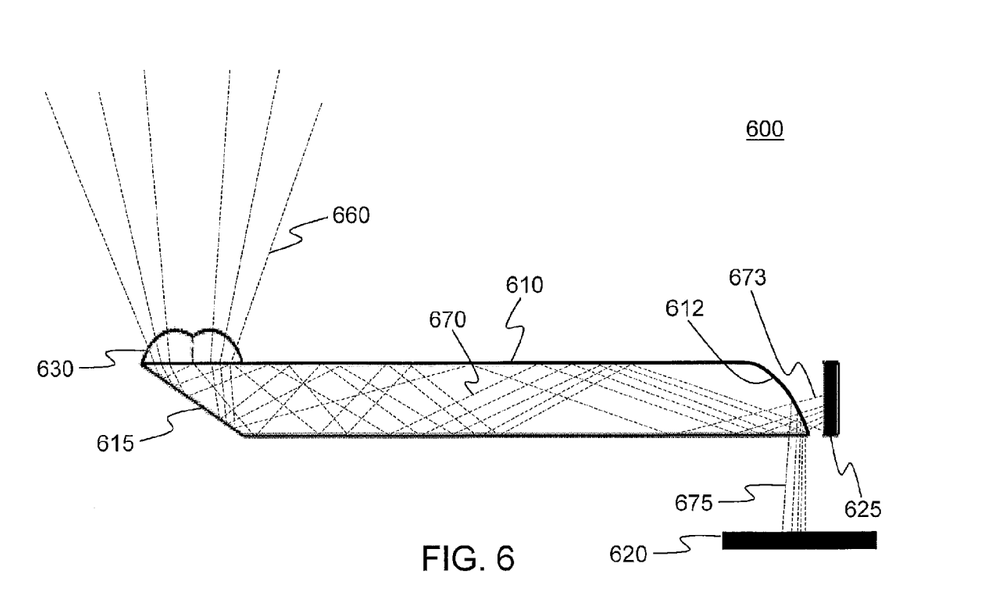

FIG. 6 is a cross-section of a portion of a light concentration and energy conversion system 600, according to an embodiment. System 600 may comprise one or more light concentrators (not shown) that comprise a plurality of light-converging elements, similar to elements 145 in FIG. 1, for example. Such light-converging elements may produce a converging cone of light 660. A light director 630, optically coupled to a light guide 610, may comprise one or more lenses through which converging light 660 transmits. In one implementation, light 660 entering light director 630 may be collimated to produce substantially parallel light. In another implementation, light 660 entering light director 630 may be collimated to produce light entering light guide 610 having a reduced convergence angle or increased f-number compared to light 660.

Collimated light resulting from transmission through light director 630 may transmit through a portion of light guide 610 before impinging on an inside end-surface of light guide 610, which may comprise a mirrored surface 615. For example, surface 615 may be optically coated to internally reflect light. Such an optical coating may comprise one or more metallic or dielectric thin films, as described above, for example. In one implementation, such optical coating need not be used, since total internal reflection may occur, for example, at or beyond a Brewster's angle (not shown). Light 670, reflected from inside surface 615 of light guide 610, may then travel generally along an optical axis of light guide 610. Light 670 may comprise multiple spectral portions of light, which may be spectrally partitioned by light splitter 612. In one implementation, light splitter 612 may comprise an optically coated end-surface of light guide 610. In another implementation, light splitter 612 may comprise an optical element (e.g., an optically coated material) optically coupled to an end-surface of light guide 610. In yet another implementation, light splitter 612 may comprise a curved end-surface of light guide 610, which may be optically coated, for example. Such an optical coating may comprise one or more thin films, as described above, for example. Light splitter 612 may spectrally partition light 670 into two or more spectral portions 673 and 675. Light splitter 612 may internally reflect a first spectral portion of light 675 to a location external to light guide 610 via one surface of light guide 610. Light 675 may then impinge on a first energy conversion element 620, for example. Light splitter 612 may transmit a second spectral portion of light 673 to another location external to light guide 610 via another surface of light guide 610. Light 673 may then impinge on a second energy conversion element 625, for example.

Figure 7:
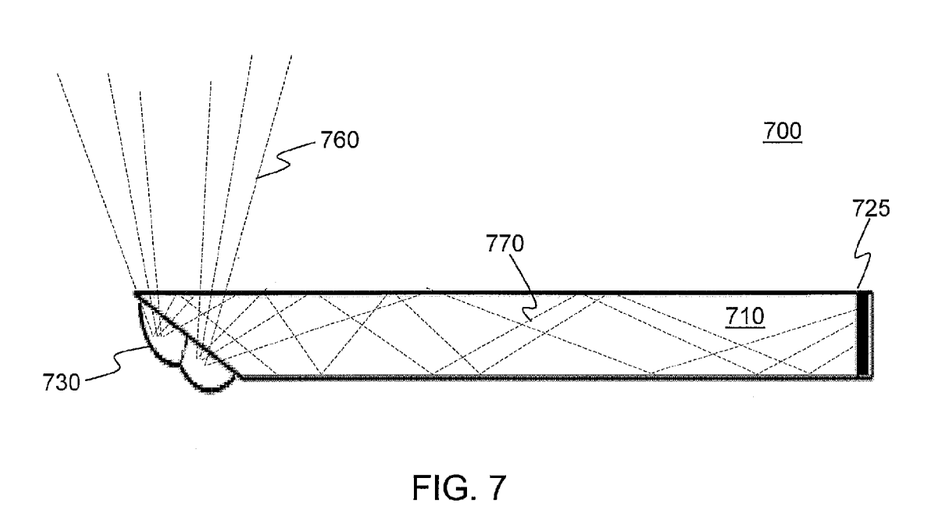

FIG. 7 is a side view of a portion of a light concentration system, according to an embodiment 700. A light director 730, optically coupled to a light guide 710, may comprise one or more lenses having an inside surface from which converging light 760 reflects. For example, light 760 may transmit through a portion of light guide 710 before impinging on inside surfaces of light director 730. Light 770, reflected from inside surfaces of light director 730, may then travel generally along an optical axis of light guide 710. Light 770 may comprise multiple spectral portions of light, which may impinge on an energy conversion element 725, for example.

Figure 8:
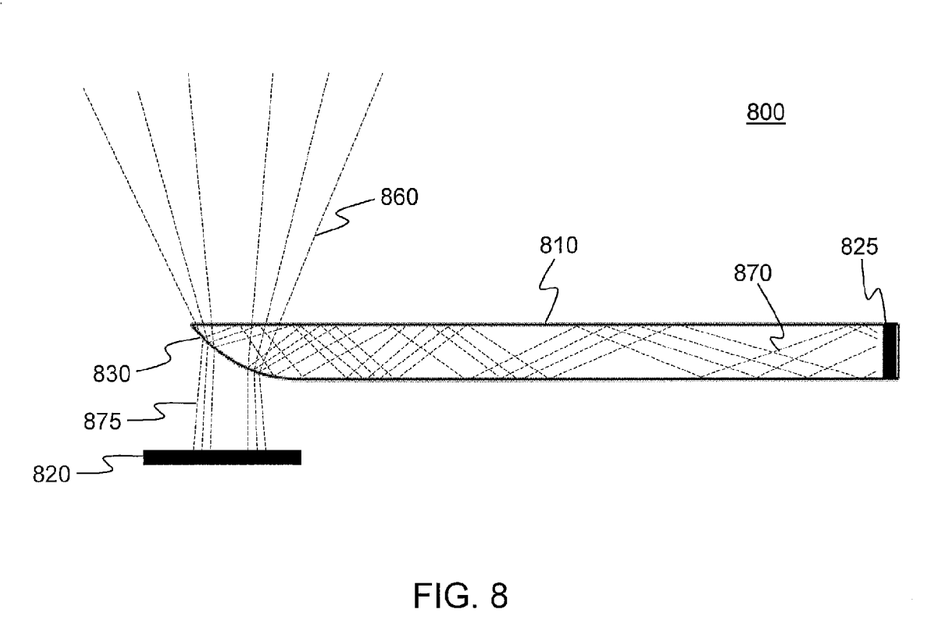

FIG. 8 is a cross-section of a light concentration system 800, according to an embodiment. System 800 may comprise one or more light concentrators (not shown) that comprise a plurality of light-converging elements, similar to elements 145 in FIG. 1, for example. Such light-converging elements may produce a converging cone of light 860. Light 860 may be focused toward a SDE 830 comprising a curved end-surface of a light guide 110. SDE 830 may spectrally partition light 860 into two or more spectral portions. In other words, light 860 may transmit through a portion of light guide 810 before impinging on SDE 830. Thus, as explained above, SDE 830 may internally reflect a first spectral portion of light 870 into light guide 810, while transmitting a second spectral portion of light 875 to a location external to light guide 810. Thus, SDE 830 may direct a first spectral portion of light 870 to a first energy conversion element 825, for example. SDE 830 may direct a second spectral portion of light 875 to a second energy conversion element 820, for example. First and/or second energy conversion elements 820 and 825 may comprise one or more devices able to convert concentrated light to another form of energy, such as electricity (e.g., via photovoltaic cells) or heat (e.g., via a heat exchanger), just to name a few examples.

In an implementation, SDE 830 may comprise an optically coated end-surface of light guide 810. Such an optical coating may comprise one or more thin films, as described above, for example. Such an optical coating may perform a function of spectrally partitioning light 860. In another implementation, SDE 830 may comprise a curved end-surface of light guide 810. Such a curved end-surface may perform a function of collimating converging light 860 to produce substantially parallel light inside light guide 810. In another implementation, light 860 impinging on SDE 830 may be collimated to produce light 870 in light guide 810 having a reduced convergence angle or increased f-number compared to light 860.

The terms, "and," "and/or," and "or" as used herein may include a variety of meanings that also is expected to depend at least in part upon the context in which such terms are used. Typically, "or" as well as "and/or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe some combination of features, structures, or characteristics. Though, it should be noted that this is merely an illustrative example and claimed subject matter is not limited to this example.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. An apparatus comprising:
a light concentrator to convert incident light to converging light, wherein the light concentrator comprises at least a first light-converging element to focus the converging light in a first direction and a second light-converging element to focus the converging light in a second direction, the second direction making a converging angle with the first direction; the light-converging elements being eccentric type optical elements each of which having asymmetrical thickness distribution;
a light splitting element to receive the converging light from the first and second light-converging elements and to split the converging light into a first spectral portion of light and a second spectral portion of light; and
a light directing element including at least a first curved surface and a second curved surface to direct the first spectral portion of light through a light guide and to direct the second spectral portion of light to a receiver external to the light guide,
wherein the receiver is spaced from the light guide,
wherein the light guide is positioned between the receiver and the light concentrator,
wherein the first and second curved surfaces are arranged relative the first light-converging element and the second light converging element, respectively, such that the second spectral portion of light from the first curved surface directed to the receiver and the second spectral portion of light from the second curved surface directed to the receiver are collimated, and further wherein a light path of the second spectral portion of light between the light splitting element and the receiver passes through a space separating the receiver and the light guide.

2. The apparatus of claim 1, further comprising a first energy conversion element to receive the first spectral portion of light and a second energy conversion element to receive the second spectral portion of light, the second energy conversion element comprising the receiver external to the light guide.

3. The apparatus of claim 1, wherein the light directing element comprises a refractive lens.

4. The apparatus of claim 1, wherein the light directing element comprises a reflecting surface to direct the first spectral portion of light through the light guide and the second spectral portion of light to the receiver external to the light guide.

5. The apparatus of claim 1, wherein a single optical element comprises the light splitting element and the light directing element.

6. The apparatus of claim 5, wherein the first and second curved surfaces of the single optical element comprise at least one curved convex or concave surface to facilitate splitting the converging light into the first spectral portion of light and the second spectral portion of light and directing the first spectral portion of light into the light guide.

7. The apparatus of claim 1, wherein the light splitting element and the light guide comprise a single optical element.

8. The apparatus of claim 1, wherein the light splitting element, the light directing element, and the light guide comprise a single optical element.

9. The apparatus of claim 1, wherein the light splitting element comprises an optically coated end-face of the light guide.

10. The apparatus of claim 1, wherein the light directing element is located external to the light guide.

11. The apparatus of claim 1, wherein the light guide comprises a rod-type light guide.

12. The apparatus of claim 1, wherein the first light-converging element has a first surface curvature to focus the converging light to a first focus point, and the second light-converging element has a second surface curvature to focus the converging light to a second focus point, and wherein the first and second curved surfaces of the light directing element are located substantially near respective the first and second focus points.

13. An apparatus comprising:
a light concentrator including:
a first light-converging element having a first surface curvature to convert incident light to a first beam of converging light, and
a second light-converging element having a second surface curvature to convert the incident light to a second beam of converging light, the second surface curvature being off-axis relative to the first surface curvature such that the second beam is directed at an angle relative to the first beam, the light-converging elements being eccentric type optical elements each of which having asymmetrical thickness distribution; and
a splitting and directing element including:
a first curved surface to receive the first beam of converging light and to split the first beam of light into a first beam first spectral component and a first beam second spectral component,
a second curved surface to receive the second beam of converging light and to split the second beam of light into a second beam first spectral component and a second beam second spectral component, and
a light guide integrally coupled with the first and second curved surfaces, to direct the first beam first spectral component and the second beam first spectral component to a first energy conversion element, and to direct the first beam second spectral component and the second beam second spectral component to a second energy conversion element external to the light guide,
wherein the second energy conversion element is spaced from the light guide,
wherein the light guide is positioned between the second energy conversion element and the light concentrator,
wherein the first and second curved surfaces are arranged relative the first light-converging element and the second light-converging element, respectively, such that the first beam second spectral component and the second beam second spectral component are collimated, and further wherein a light path of the first beam second spectral component and the second beam second spectral component between the splitting and directing element to the second energy conversion element external to the light guide passes through a space separating the second energy conversion element and the light guide.

14. The apparatus of claim 13, wherein the splitting and directing element has an end surface angled with respect to the optical axis of the light guide, and wherein the first and second curved surfaces are optically coupled with the end surface such that substantially all the light received by the first and second curved surfaces from the respective first and second beams of converging light travel along an inside of the light guide.

15. The apparatus of claim 13, wherein the splitting and directing element has an end surface angled with respect to the optical axis of the light guide, and wherein the first and second curved surfaces are optically coupled with the end surface such that light from the first beam first spectral component and the second beam first spectral component travel along an inside of the light guide to the first energy conversion element, and light from the first beam second spectral component and the second beam second spectral component travel to the second energy conversion element.

16. The apparatus of claim 13, wherein a propagation direction of the first beam first spectral component and the second beam first spectral component is substantially along an optical axis of the light guide.

17. The apparatus of claim 1, wherein a propagation direction of the first spectral portion of light is substantially along an optical axis of the light guide.

18. The apparatus of claim 1, wherein the first and second curved surfaces correspond to the first and second light-converging elements on a one-to-one basis.

19. The apparatus of claim 13, wherein the first and second curved surfaces correspond to the first and second light-converging elements on a one-to-one basis.

20. The apparatus of claim 1, wherein the light guide comprises an angled end surface.

21. The apparatus of claim 1, wherein the converging light of the first light-converging element and the converging light of the second light-converging element converge in proximity to the light splitting element.

22. The apparatus of claim 21, wherein the light splitting element is arranged near an end of the light guide.

23. The apparatus of claim 13, wherein the light guide comprises an angled end surface.

24. The apparatus of claim 13, wherein the first and second beams of converging light converge in proximity to the first and second curved surfaces.

25. The apparatus of claim 24, wherein the first and second curved surfaces are arranged near an end of the light guide.

\* \* \* \* \*